US012812929B2

(12) United States Patent
Mazza et al.

(10) Patent No.: US 12,812,929 B2
(45) Date of Patent: Nov. 24, 2026

(54) GATE CONTACT WITH CONCURRENT TIE-DOWN CONNECTION

(71) Applicant: INTERNATIONAL BUSINESS MACHINES CORPORATION, Armonk, NY (US)

(72) Inventors: James P Mazza, Saratoga Springs, NY (US); Ruilong Xie, Niskayuna, NY (US); Koichi Motoyama, Clifton Park, NY (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 18/581,707

(22) Filed: Feb. 20, 2024

(65) Prior Publication Data

US 2025/0267903 A1 Aug. 21, 2025

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |
| ***H10W 20/41*** | (2026.01) |

(52) U.S. Cl.

CPC ......... *H10D 62/118* (2025.01); *H10D 30/014* (2025.01); *H10D 30/43* (2025.01); *H10D 30/6735* (2025.01); *H10D 30/6757* (2025.01); *H10D 62/151* (2025.01); *H10D 64/017* (2025.01); *H10D 64/018* (2025.01); *H10D 84/013* (2025.01); *H10D 84/0149* (2025.01); *H10D 84/038* (2025.01); *H10D 84/83* (2025.01); *H10W 20/427* (2026.01)

(58) Field of Classification Search

CPC ..... H10D 62/118; H10D 30/014; H10D 30/43

See application file for complete search history.

(56) References Cited

U.S. PATENT DOCUMENTS

| | | | |
|---|---|---|---|
| 9,691,897 | B2 | 6/2017 | Xie et al. |
| 9,929,048 | B1 | 3/2018 | Xie et al. |
| 10,283,408 | B2 | 5/2019 | Xie et al. |
| 10,566,430 | B2 | 2/2020 | Cheng et al. |
| 10,943,990 | B2 | 3/2021 | Greene et al. |
| 11,296,029 | B2 | 4/2022 | Kim et al. |
| 11,637,186 | B2 | 4/2023 | You et al. |
| 2014/0077305 | A1 | 3/2014 | Pethe et al. |

(Continued)

*Primary Examiner* — Errol V Fernandes

(74) *Attorney, Agent, or Firm* — Harrity & Harrity, LLP

(57) ABSTRACT

A semiconductor device includes a first gate structure having a gate metal. A gate contact is connected to the gate metal of the first gate structure. The gate contact is disposed between first source/drain contacts and has a height greater than the first source/drain contacts to overlap the first source drain contacts. A second gate structure has a gate metal. A gate tie-down is connected to the gate metal of the second gate structure and one of a pair of second source/drain contacts. The gate tie-down has a height greater than the pair of second source/drain contacts to overlap the other of the pair of the second source drain contacts.

20 Claims, 9 Drawing Sheets

(56) References Cited

U.S. PATENT DOCUMENTS

| | | | | |
|---|---|---|---|---|
| 2016/0133623 | A1* | 5/2016 | Xie | H10D 84/83 438/586 |
| 2016/0379925 | A1* | 12/2016 | Ok | H10P 14/40 438/666 |
| 2017/0047254 | A1* | 2/2017 | Fan | H10D 64/018 |
| 2017/0092764 | A1 | 3/2017 | Xie et al. | |
| 2018/0261540 | A1* | 9/2018 | Lee | H10W 20/0698 |
| 2019/0319105 | A1 | 10/2019 | Cheng et al. | |
| 2020/0135886 | A1 | 4/2020 | Greene et al. | |
| 2020/0161439 | A1 | 5/2020 | You et al. | |
| 2021/0233847 | A1 | 7/2021 | Kim et al. | |
| 2022/0109055 | A1 | 4/2022 | Lee et al. | |
| 2022/0165857 | A1 | 5/2022 | Park et al. | |
| 2023/0027769 | A1 | 1/2023 | Park et al. | |
| 2024/0321982 | A1 | 9/2024 | Xie et al. | |

* cited by examiner

GATE CONTACT WITH CONCURRENT TIE-DOWN CONNECTION

BACKGROUND

The present invention generally relates to semiconductor devices and processing methods, and more particularly to gate contacts that also provide a gate-tie down connection.

A gate tie-down provides a connection between a gate conductor and a power rail through a source or drain region. Since the gate tie-down needs to be electrically isolated from other contacts, electrically isolated metallization structures are often employed to provide the gate tie-down. The electrically isolated metallization structures can extend through multiple layers of the device and can include a large footprint to connect all relevant components.

Options for the placement of components, such as gate contacts and gate tie-downs are limited especially among source/drain contacts which compete for available space. This makes gate and gate contact placement exceedingly difficult in view of decreasing sizes of source/drain regions.

SUMMARY

In accordance with an embodiment of the present invention, a semiconductor device includes a first gate structure having a gate metal. A gate contact is connected to the gate metal of the first gate structure. The gate contact is disposed between first source/drain contacts and has a height greater than the first source/drain contacts to overlap the first source drain contacts. A second gate structure has a gate metal. A gate tie-down is connected to the gate metal of the second gate structure and one of a pair of second source/drain contacts. The gate tie-down has a height greater than the pair of second source/drain contacts to overlap the other of the pair of the second source drain contacts.

In other embodiments, the gate tie-down can be disposed asymmetrically between the pair of second source/drain regions contacts such that the gate tie-down is over the one of the pair of second source/drain contacts. The gate tie-down can be electrically isolated from the other of the pair of the second source/drain contacts. A spacer can be disposed between the gate tie-down and the other of the pair of the second source/drain contacts. The gate contact can overlap at least one of the first source/drain contacts such that the gate contact connects to a metal line over a source/drain region. The gate contact is electrically isolated from the first source/drain contacts by a spacer disposed between the gate contact and the first source/drain contacts. The gate contact and the gate tie-down can include a same material. The gate tie-down can connect to an M1 power rail.

In accordance with another embodiment of the present invention, a semiconductor device includes a first gate structure having a gate metal and a gate contact connected to the gate metal of the first gate structure. The gate contact is disposed between first source/drain contacts and has a height greater than the first source/drain contacts to overlap the first source drain contacts. A first spacer is disposed about a lateral portion of the gate contact to electrically isolate the gate contact from the first source/drain contacts. A second gate structure has a gate metal. A gate tie-down is connected to the gate metal of the second gate structure and one of a pair of second source/drain contacts. The gate tie-down has a height greater than the pair of second source/drain contacts to overlap the other of the pair of the second source drain contacts. A second spacer is disposed about a lateral portion of the gate tie-down to electrically isolate the gate contact from the other of the pair of the second source drain contacts.

In other embodiments, the gate tie-down can be disposed asymmetrically between the pair of second source/drain regions contacts such that the gate tie-down is over the one of the pair of second source/drain contacts. The gate contact can overlap at least one of the first source/drain contacts such that the gate contact connects to a metal line over a source/drain region. The gate contact and the gate tie-down can include a same material. The first spacer and the second spacer can include a same material. The gate tie-down can connect to an M1 power rail.

In accordance with another embodiment of the present invention, a method for fabricating a semiconductor device includes forming dielectric caps over gate metal of gate structures; depositing a first dielectric layer over the dielectric caps; forming source/drain contacts between the gate structures; depositing a second dielectric layer over the source/drain contacts; exposing the gate metal and the source/drain contacts by forming openings in different regions through the second dielectric layer; forming a dielectric spacer in the openings; and concurrently forming a gate contact and a gate tie-down in the openings where the gate contact electrically connects to the gate metal and the gate tie-down electrically connects to the gate metal and one of the source/drain contacts.

In other embodiments, the gate tie-down can be formed on top of the one of the source/drain contacts. The gate contact can overlap adjacent source/drain region contacts. The gate tie-down can connect to an M1 power rail. Concurrently forming the gate contact and the gate tie-down can include concurrently forming the gate contact and the gate tie-down in the openings and vias in via openings. The gate tie-down can connect to an M1 power rail by one of the vias.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
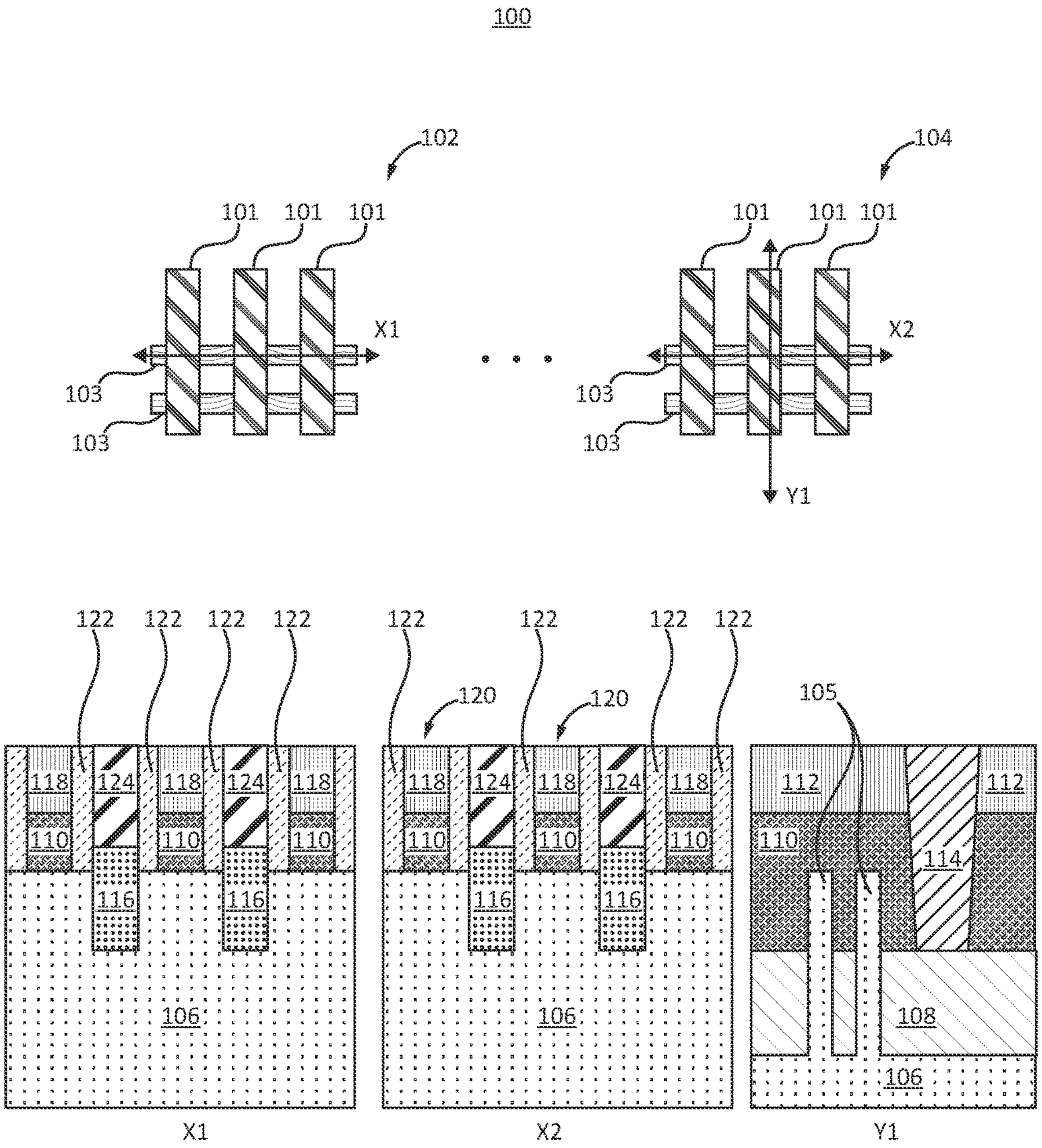
FIG. 1 shows layout views showing cross-section lines X1, X2 and Y1 showing corresponding cross-sectional views X1, X2 and Y1 of a semiconductor device having dielectric caps formed on gate structures, in accordance with an embodiment of the present invention.

In accordance with embodiments of the present invention, devices and methods are described which include forming gate contacts and tie-downs on a semiconductor device. Gate contacts and tie-downs in accordance with embodiments of the present invention can concurrently provide a gate contact to a source/drain region in one position and connect a power rail to another source/drain region in another position (forming a gate-tie down). Concurrently forming a gate contact and gate tie-down is challenging as competing requirements are difficult to meet. For example, a gate contact can only contact a gate conductor and not connect to nearby source/drain (S/D) contacts. In addition, a gate tie-down needs to connect a gate conductor to a S/D contact or region without using metal wiring resources.

In embodiments of the present invention, concurrently formed gate contacts and gate tie-downs are provided. In an embodiment, the gate tie-down portion connects both a gate conductor and a S/D contact or region on one side of the gate tie-down while a second side of the gate tie-down is isolated from nearby contacts using an inner spacer.

The gate tie-down can overlap an adjacent S/D contact from which the gate tie-down is isolated, and further overlap and connect the gate tie-down to the S/D contact or S/D region. The gate tie-down can be vertically disposed. A cross-section of the gate tie-down in a plane parallel to a plane of a substrate on which the semiconductor device is formed includes a shape having a longer side orthogonally disposed to a shorter side. In an embodiment, the longer side extends over and connects the gate conductor and the S/D contact or region. The shorter side extends over and overlaps with adjacent S/D contacts between which the gate tie-down is disposed and is electrically isolated from the adjacent S/D contact on this side. The gate contacts can be formed with a similar overlap over adjacent S/D region contacts.

In accordance with an embodiment of the present invention, a semiconductor device includes a first gate structure having a gate metal. A gate contact is connected to the gate metal of the first gate structure. The gate contact is disposed between first source/drain contacts and has a height greater than the first source/drain contacts to overlap the first source drain contacts. A second gate structure has a gate metal. A gate tie-down is connected to the gate metal of the second gate structure and one of a pair of second source/drain contacts. The gate tie-down has a height greater than the pair of second source/drain contacts to overlap the other of the pair of the second source drain contacts.

In embodiments of the present invention, methods for forming a semiconductor device having gate tie-downs and gate contacts concurrently formed can include forming a self-aligned gate cap over gate conductors after a replacement metal gate process is performed. An interlevel dielectric (ILD) layer is deposited and planarized at a middle of the line (MOL) level. S/D contacts are formed through the ILD layer with respect to the gate caps, and gate spacers are formed about the gate conductors. Another ILD layer is formed over the semiconductor device. Gate contact openings are formed through the ILD layers with overlap to adjacent S/D contacts. The overlap can include an overlap of up to about 12 nm with the S/D contacts for the gate tie-down. The gate contact opening can include an overlap of more than 5 nm over the S/D contacts, and even up to or beyond 12 nm.

An inner spacer or dielectric spacer is formed for both gate contacts and gate tie-downs in the respective gate contact openings, such that the gate contacts are isolated from the S/D contacts, and the gate tie-down is connected to a S/D region and gate conductor with an extended (larger) overlap. Gate contact metallization is formed to concurrently fill both gate contacts and gate tie-downs.

In accordance with another embodiment of the present invention, a method for fabricating a semiconductor device includes forming dielectric caps over gate metal of gate structures; depositing a first dielectric layer over the dielectric caps; forming source/drain contacts between the gate structures; depositing a second dielectric layer over the source/drain contacts; exposing the gate metal and the source/drain contacts by forming openings in different regions through the second dielectric layer; forming a dielectric spacer in the openings; and concurrently forming a gate contact and a gate tie-down in the openings where the gate contact electrically connects to the gate metal and the gate tie-down electrically connects to the gate metal and one of the source/drain contacts.

The gate tie-down enables a reduction in a layout footprint by enabling the placement of a gate tie-down in a same sized area as a gate contact for a given design. The gate tie-down structure may be employed in memory devices, e.g., static random access memory (SRAM), processors, or other chip devices.

Referring now to the drawings in which like numerals represent the same or similar elements and initially to FIG. 1, devices and methods for manufacturing a semiconductor device 100 are shown in accordance with embodiments of the present invention. The semiconductor device 100 can be included in any semiconductor chip. In particularly useful embodiments, the semiconductor device includes a nanosheet channel field effect transistor (FET) device or a fin FET device but may include other types of devices as well.

An inset 102 shows a top-down layout view where a section line X1 indicates a first position in the layout view of the semiconductor device where cross-section X1 is taken. An inset 104 shows a second position in a layout view for the semiconductor device 100 where section lines X2 and Y1 are taken. Inset 102 depicts a region where a gate contact is to be formed, and inset 104 represents another area of the semiconductor device 100 where a gate tie-down is to be formed. The areas where insets 102 and 104 are placed in accordance with a chip design can be anywhere and any number on the semiconductor device 100. Insets 102 and 104 include gate lines 101 and active regions 103 orthogonally disposed relative to one another. It should be noted that channels are formed at intersection regions between the between the gate lines 101 and active regions 103 and can include nanosheet channels, fin channels or any other suitable channel structure.

The semiconductor device 100 (or semiconductor wafer) includes a substrate 106 that can include a single bulk material or have multiple layers on which the semiconductor device will be fabricated. The substrate 106 can include any suitable substrate structure or material, e.g., a bulk semiconductor, a semiconductor-on-insulator (SOI) substrate, etc., and preferably includes a monocrystalline semiconductor. In one example, the substrate 106 can include substrate portions separated by an etch stop layer (not shown).

Substrate 106 preferably includes silicon-containing material. Illustrative examples of Si-containing materials suitable for the substrate 106 can include, but are not limited to Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

A layer stack or stacks are applied to or formed on the substrate 106. In one embodiment, one or more nanosheet (NS) stacks (not shown) can be applied to the substrate 106 and patterned. In another embodiment, fins 105 can be formed which can be etched or epitaxially grown from the substrate 106.

Substrate 106 can be etched to form shallow trenches therein in accordance with an etch mask. Shallow trench isolation (STI) 108 or STI regions are formed in the etched trenches. STI 108 can be formed by depositing dielectric material, such as, e.g., $SiO_2$, $SSiO_xN_y$, SiCO or other suitable compounds. STI 108 can be deposited using chemical vapor deposition (CVD), although other deposition methods can be employed. The STI 108 can then be etched, e.g., by RIE, to a level below a top of the substrate 106.

A dummy gate material has been replaced by replacement metal that forms a gate metal 110. The dummy material (not shown) is blanketed over the semiconductor device 100 followed by a blanket deposition of a hard mask material to later form a patterned hard mask, e.g., by using photolithographic patterning. The dummy gate material can include a polysilicon, amorphous Si or other selectively removeable material. The hard mask is employed to etch and shape the dummy gates.

A deposition process is employed to form spacers 122. Spacers 122 can include an oxide or a nitride which can be deposited conformally by a CVD process followed by a spacer etch to remove the oxide from horizontal surfaces.

An epitaxial growth process is performed to form source/drain (S/D) regions 116. S/D regions 116 can include Si or SiGe and include faceted surfaces when epitaxial growth is not confined. In one embodiment, the S/D regions 116 can be designated as P-type or N-type devices. The P-type and N-type devices can have material selected for the S/D regions 116. For example, if the S/D regions 116 include N-type devices than the S/D regions 116 can include Si. In another example, if the S/D regions 116 include P-type devices than the S/D regions 116 can include SiGe. The S/D regions 116 can be appropriately doped during formation by epitaxial growth. For example, the S/D regions 116 can be doped by introducing p dopants (e.g., B, Ga, etc.) during epitaxial formation. Similarly, the S/D regions 116 can be doped by introducing n dopants (e.g., P, As, etc.) during epitaxial formation.

In other embodiments, P-type and N-type devices can be formed adjacent to one another. Processing would include forming one device type and then the other device type by employing block masks to protect each device during processing of the other.

A dielectric layer 124, such as, e.g., an interlevel dielectric layer (ILD) can be formed and can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric layer 124 can be deposited using chemical vapor deposition (CVD), although other deposition methods can be employed.

S/D regions 116 are laterally disposed relative to one another in a row. Regions between adjacent S/D regions 116 include gate structures 120. The gate structures 120 can have device channels formed from, e.g., nanosheet layers or fins 105 passing therethrough. Other device architectures are also contemplated and the gate structures and the device channels can take other forms.

The gate structures 120 are formed by removing the hard mask and the dummy material for dummy gates. The gate structures 120 include gate dielectric (not shown) formed in contact with semiconductor material which forms the device channels, in this illustrative example. A gate electrode or gate metal 110 is deposited to replace the dummy gate material. The gate structures 120 can include Replacement Metal Gate (RMG) structures. The gate electrode or gate metal 110 is also electrically isolated by spacers 122. The dielectric layer 124 and gate metal 110 may be planarized, e.g., by chemical mechanical polishing (CMP).

The gate metal 110 is exposed between spacers 122 by an etching process. A deposition process, e.g., CVD can be employed to deposit a capping layer 112. The capping layer 112 can include a silicon nitride although other dielectric materials can be employed, e.g., a high dielectric constant material such as, e.g., $Al_2O_3$, $HfO_2$, etc. A planarization process (e.g., CMP) can be performed to planarize a free surface of the semiconductor device 100 and form self-aligned caps 118.

A patterned photoresist can be formed on the capping layer 112 by applying a blanket photoresist layer (not shown) to the surface of the capping layer 112 and exposing the photoresist layer to a pattern of radiation, and then developing the pattern into the photoresist layer utilizing resist developer. The pattern in the photoresist layer is transferred to the capping layer 112 by an etch process. A trench can be etched through the capping layer 112 and the gate metal 110 down to the STI 108 and filled with a dielectric material, such as a silicon oxide. A planarization process (e.g., CMP) can be employed to level the free surface of the semiconductor device 100 and form a gate cut 114.

Figure 2:
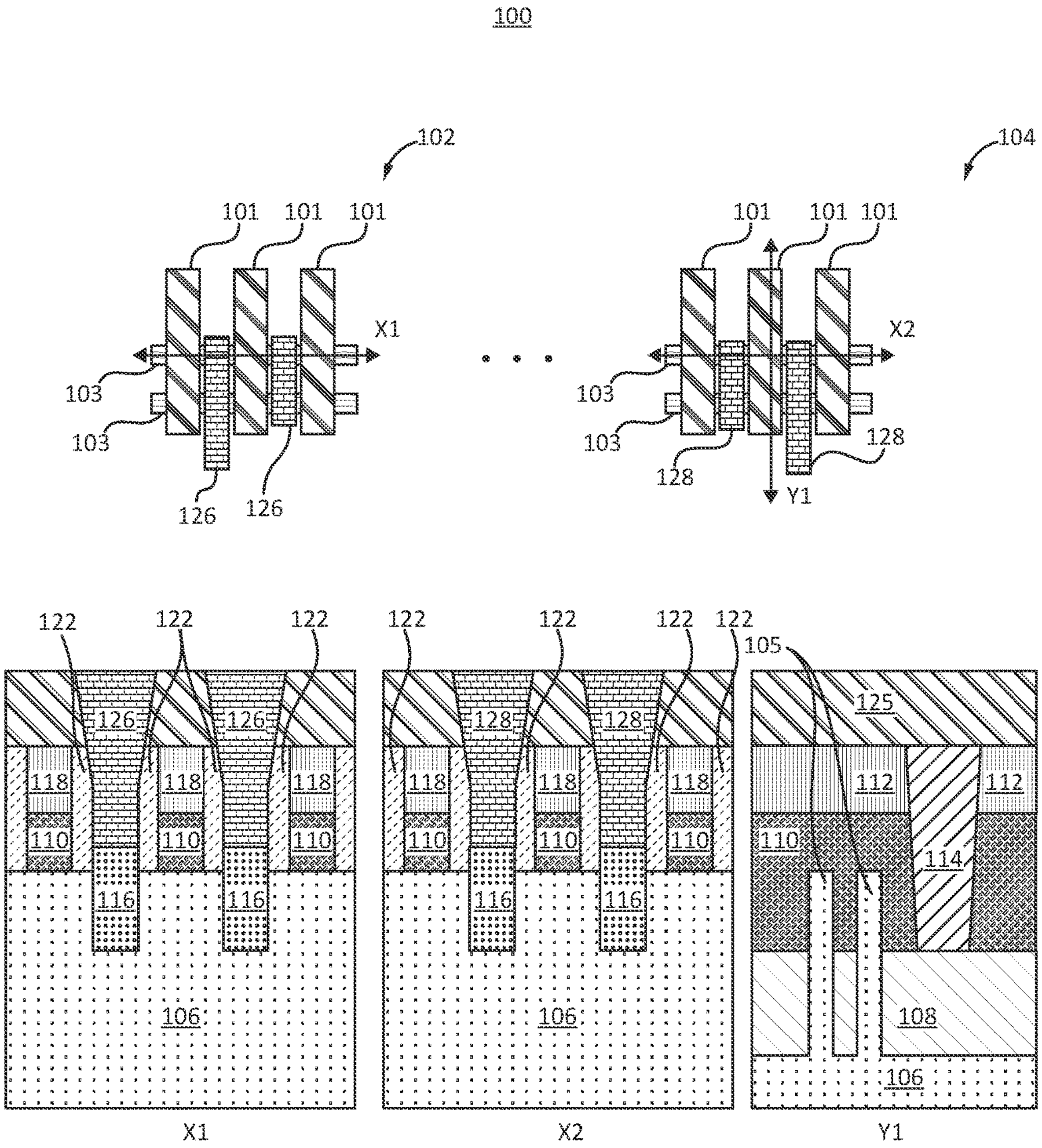
FIG. 2 shows cross-sectional views X1, X2 and Y1 of the semiconductor device having source/drain contacts formed through an interlevel dielectric layer, in accordance with an embodiment of the present invention.

Referring to FIG. 2, middle of the line (MOL) contacts can be formed to make connections with the S/D regions 116. A dielectric layer 125 can be deposited on the semiconductor device 100. Contact openings can be formed in and through the dielectric layer 125 and the dielectric layer 124 disposed over the S/D regions 116. An etch process such as, e.g., a RIE can be employed to open up the dielectric layer 125 and remove material of the dielectric layer 124 disposed between spacers 122. Spacers 122 can be eroded to form a tapered contact opening. In an embodiment, a silicide liner (not shown), such as Ti, Ni, NiPt can be deposited in the contact openings for the S/D region contacts, then a diffusion barrier (not shown) can be formed in contact openings prior to a conductive fill for the formation of MOL contacts. The diffusion barrier can include, e.g., TiN, TaN, or similar materials. A conductive fill is performed, which can include materials, such as, e.g., Cu, Ru, Mo, Rh, W, Ir, and alloys or combinations of these and other conductive materials. A planarization process is performed to form contacts 126 and 128.

Figure 3:
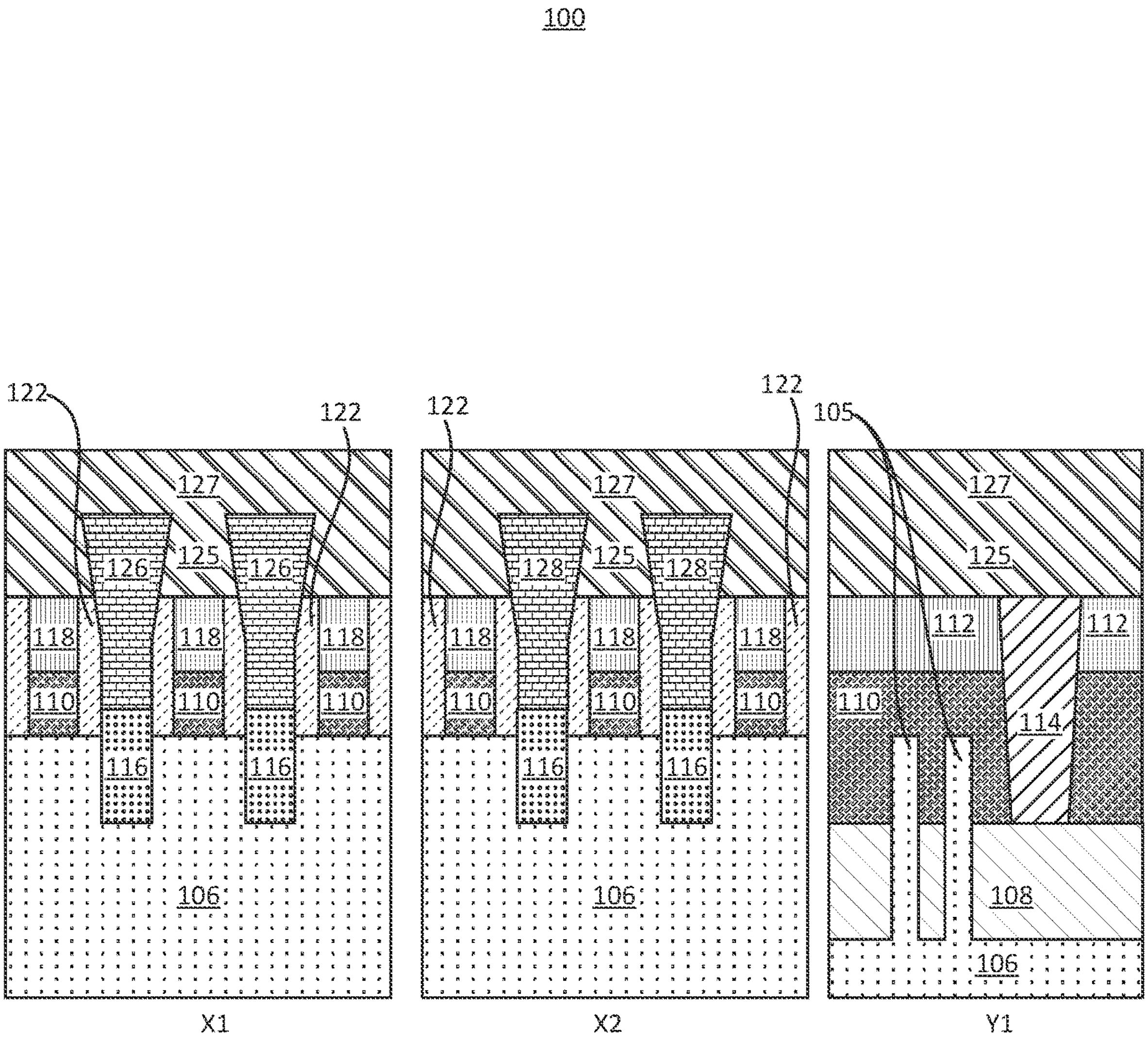
FIG. 3 shows cross-sectional views X1, X2 and Y1 of the semiconductor device having an additional interlevel dielectric material formed over the source/drain contacts, in accordance with an embodiment of the present invention.

Referring to FIG. 3, a dielectric layer 127 (e.g., an additional interlevel dielectric layer (ILD)) is formed over the semiconductor device 100. The dielectric layer 127 can include similar materials and formation processes as dielectric layers 124 and 125. The dielectric layer 127 may be planarized, e.g., by CMP.

Figure 4:
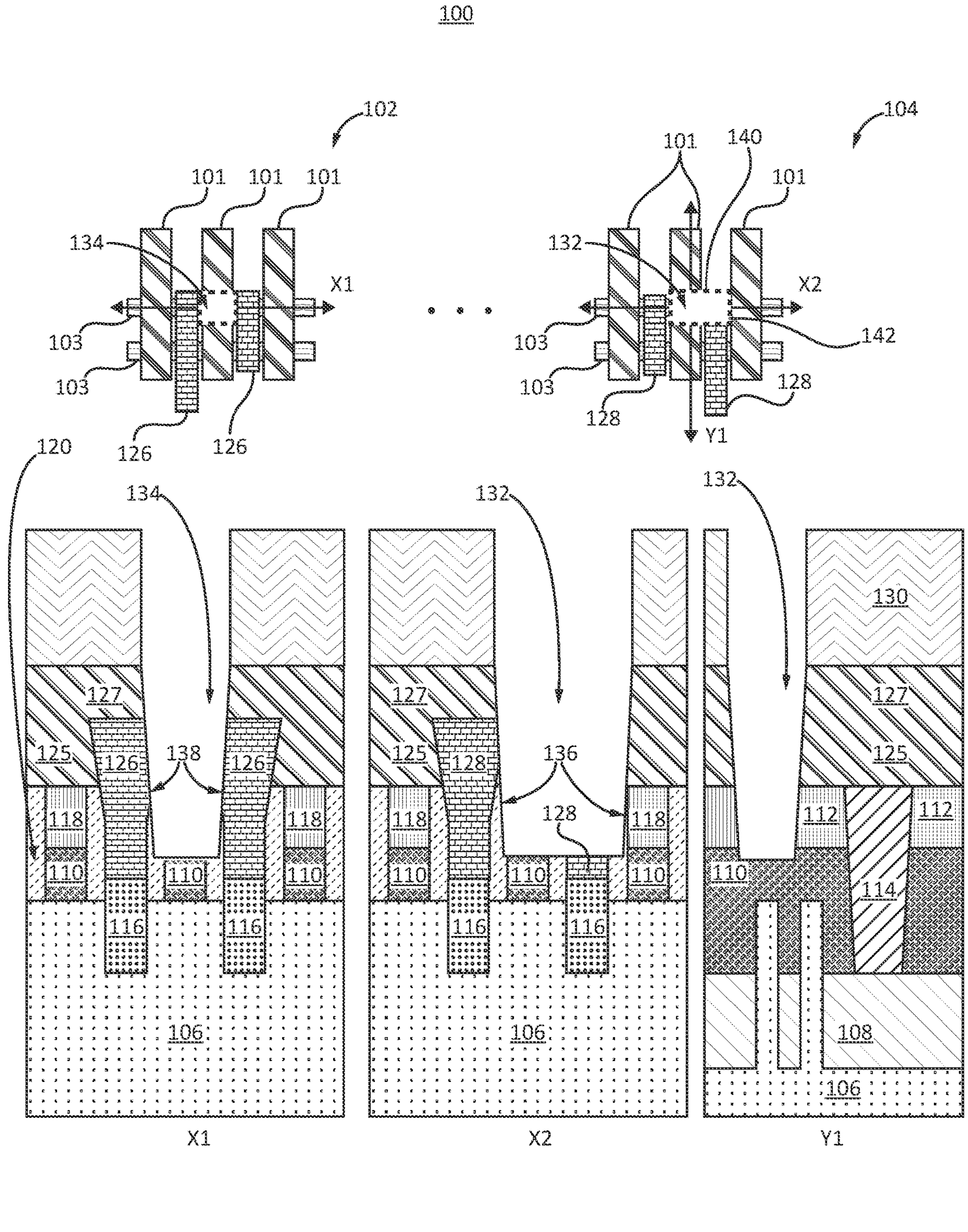
FIG. 4 shows cross-sectional views X1, X2 and Y1 of the semiconductor device having openings formed to expose source/drain contacts and gate metal, in accordance with an embodiment of the present invention.

Referring to FIG. 4, a mask material 130 is deposited or spun onto the semiconductor device 100. In an embodiment, the mask material 130 includes a hard mask material that can be patterned using photolithography, e.g., using a photoresist (not shown). In some embodiments, an anti-reflective coating (ARC) layer (not shown) may be formed prior to forming the photoresist, which can be formed on the ARC layer. The layer of photoresist can be imaged with an image pattern and developed to form an etch mask. In an embodiment, an organic planarization layer (OPL) can be employed as the mask material 130.

The dielectric layer 127, portions of the contacts 126, portions of contacts 128, spacers 122 and caps 118 are etched to form openings 132 and 134 in accordance with the patterned masking material 130. Openings 132 and 134 can be etched using an anisotropic etching process, e.g., RIE. Contacts 126 and contacts 128 are etched back to form tapered profiles 136 and 138, respectively in openings 132 and 134. Opening 134 is formed over the gate metal 110 between contacts 126. The gate metal 110 is exposed within the opening 134 so that electrical contact can be made thereto by a later formed gate contact. Opening 132 is formed over and spans across the gate metal 110 and one of contacts 128. The gate metal 110 and the contact 128 are exposed within the opening 132 so that electrical contact and a connection therebetween can be made by a later formed gate tie-down.

It is noted that the opening 132 includes a long dimension 140 and a short dimension 142. The long dimension 140 covers a length of the gate metal 110 and the contact 128 at a bottom of the opening 132. The mask material 130 is removed from layer 127. The removal of mask material 130 can include CMP or an ash process in the case where OPL is employed.

Figure 5:
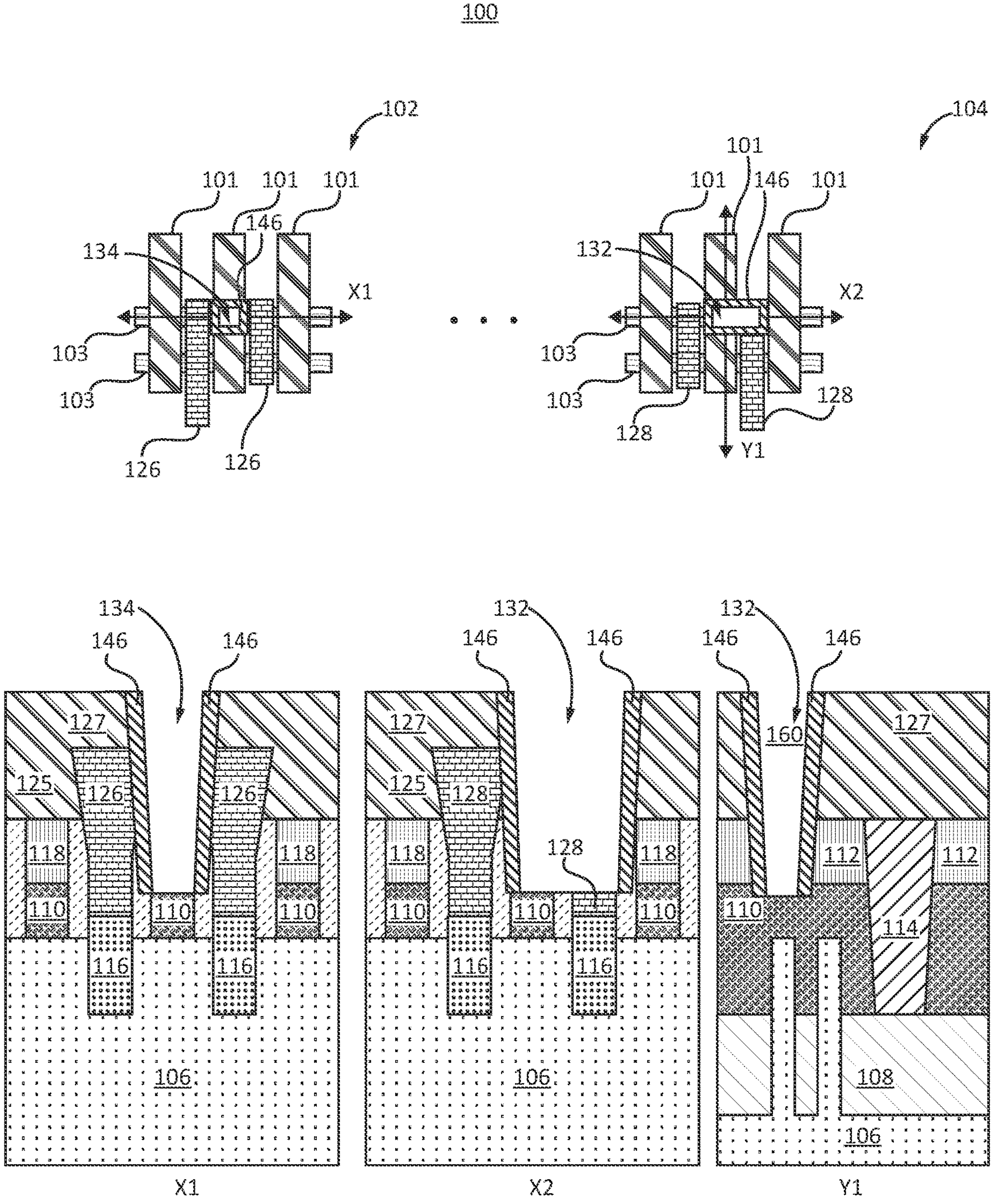
FIG. 5 shows cross-sectional views X1, X2 and Y1 of the semiconductor device having the openings lined with a dielectric spacer to create electrical isolation around lateral portions of the openings, in accordance with an embodiment of the present invention.

Referring to FIG. 5, a dielectric layer is conformally formed over a top of the semiconductor device 100 and within openings 132 and 134. The dielectric layer will be employed to form sidewall spacers 146 in contact with the sidewalls of the openings 132 and 134. The dielectric layer can be formed by depositing a conformal layer of dielectric material, such as oxide, nitride or oxynitride. In particularly useful embodiments, the dielectric layer can include SiN, SiNC or other suitable materials. The dielectric layer can be deposited using, e.g., a CVD method.

An etch-back process is performed to remove the dielectric layer from horizontal surfaces to form sidewall spacers 146 within openings 132 and 134. The dielectric layer remains on the sidewalls of the openings 132 and 134 to electrically isolate later formed gate contacts and gate tie-downs. The etch-back process can include RIE or ion beam etch (IBE) process.

Figure 6:
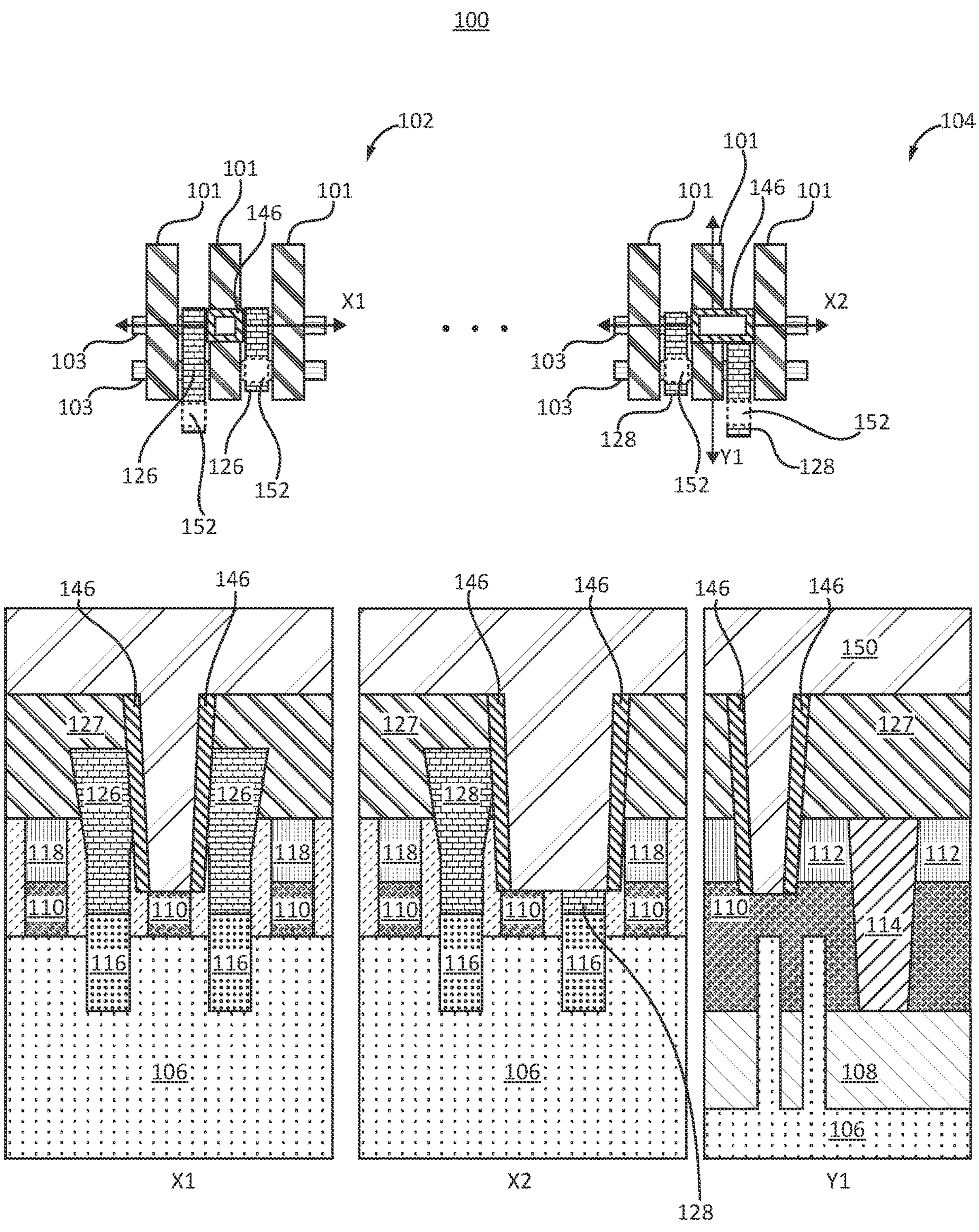
FIG. 6 shows cross-sectional views X1, X2 and Y1 of the semiconductor device having the openings filled and a pattern formed for etching additional via holes for the source/drain contacts, in accordance with an embodiment of the present invention.

Referring to FIG. 6, a mask material 150 is deposited or spun onto the semiconductor device 100. In an embodiment, the mask material 150 includes a hard mask material that can be patterned using photolithography, e.g., using a photoresist (not shown). In some embodiments, an anti-reflective coating (ARC) layer (not shown) may be formed prior to forming the photoresist, which can be formed on the ARC layer. The layer of photoresist can be imaged with an image pattern and developed to form an etch mask. In an embodiment, an organic planarization layer (OPL) can be employed as the mask material 150. The mask material 150 is patterned to open up via holes 152 for via connections in other portions of the semiconductor device 100.

The masking material 150 is then removed. The removal of mask material 150 can include CMP or an ash process in the case where OPL is employed.

Figure 7:
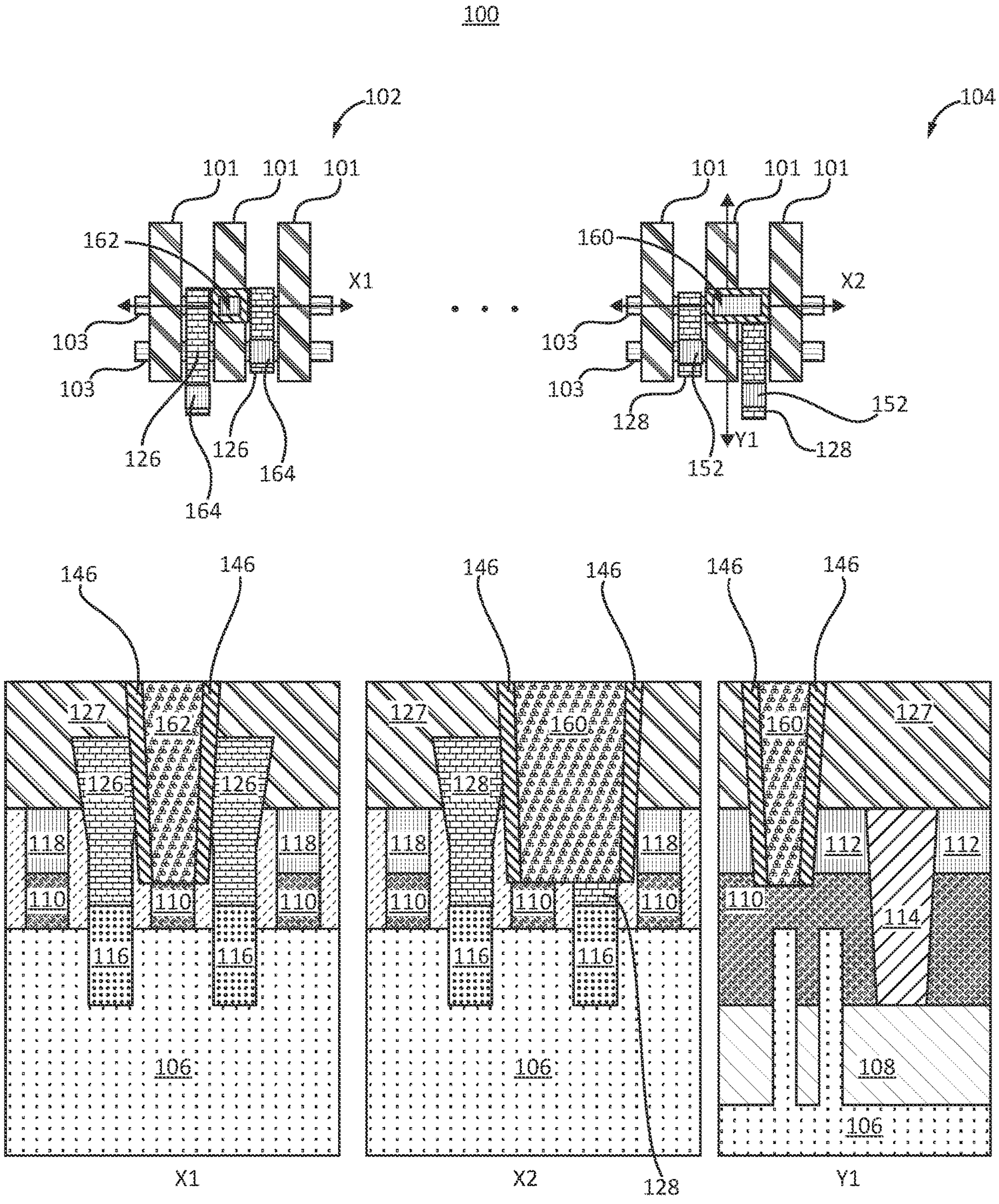
FIG. 7 shows cross-sectional views X1, X2 and Y1 of the semiconductor device having the openings filled to concurrently form gate contacts and gate tie-downs in different regions of the semiconductor device, in accordance with an embodiment of the present invention.

Referring to FIG. 7, a diffusion barrier can optionally be deposited in the openings 132, 134 and via holes 152 prior to a conductive fill. The diffusion barrier can include, e.g., TiN, TaN, or similar materials. A conductive fill is performed to concurrently fill the openings 132, 134 and via holes 152. The conductive fill can include materials, such as, e.g., Cu, Ru, Mo, Rh, W, Ir, and alloys or combinations of these and other conductive materials. In a particularly useful embodiment, the conductive fill includes Cu. The conductive fill can be formed using a deposition method, such as, e.g., CVD, plasma enhanced CVD (PECVD), atomic layer deposition (ALD) or any other suitable deposition method. The conductive fill can be planarized, e.g., by CMP, to remove excess material of the conductive fill and to concurrently form a gate contact 162, a gate tie-down 160 and vias 164. The gate contact 162 makes an electrical connection with gate metal 110 within opening 134. The gate tie-down 160 makes an electrical connection to the gate metal 110 and the contact 128 within opening 132. The vias 164 can make connections to contacts 126, contacts 128 or other metal structures in the semiconductor device 100.

Figure 8:
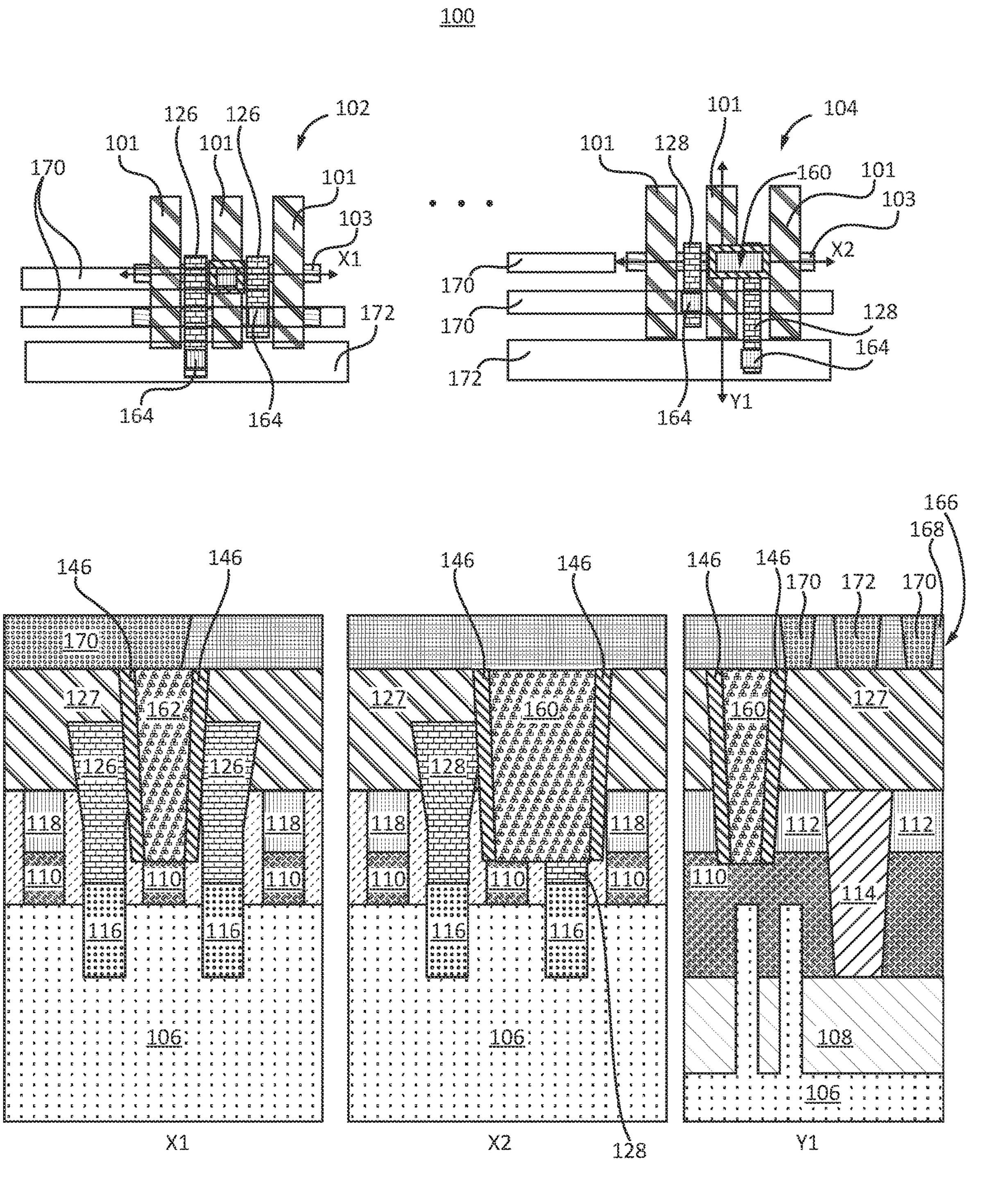
FIG. 8 shows cross-sectional views X1, X2 and Y1 of the semiconductor device having another interlevel dielectric layer formed having M1 metal lines and an M1 power rail formed therein, in accordance with an embodiment of the present invention.

Referring to FIG. 8, a back end of the line (BEOL) layer 166, which can include a dielectric layer 168, metal lines 170 and a power rail 172 are formed. The dielectric layer 168 can include an ILD formed from any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric layer 168 can be deposited using chemical vapor deposition (CVD), although other deposition methods can be employed.

The dielectric layer 168 is patterned and a conductive fill is performed followed by a planarization process (e.g., CMP) to form metal lines 170 (e.g., M1 metal lines) and the power rail 172 (e.g., M1 power rail). The metal lines 170 and the power rail 172 can include materials, such as, e.g., Cu, Ru, Mo, Rh, W, Ir, and alloys or combinations of these and other conductive materials. In a particularly useful embodiment, the metal lines 170 and the power rail 172 include Cu.

The conductive fill can be formed using a deposition method, such as, e.g., CVD, PECVD, ALD or any other suitable deposition method.

The metal lines 170 make electrical connections to the gate contacts 162. The gate tie-down 160 connects the gate metal 110 to the contact 128. The gate tie-down 160 has a top surface electrically isolated with the formation of the dielectric layer 168. The gate tie-down 160 connects to the power rail 172 by contact 128 as shown in inset 104 of FIG. 8. Processing can continue with the formation of other BEOL metallization structures.

In section X1 of FIG. 8, the gate contact 162 extends above the contacts 126 for the S/D regions 116. Said differently, a height of the gate contact 162 is greater than a height of the contacts 126. In addition, fanout of the tapered profile of the gate contact 162 overlaps the contacts 126 (e.g., when viewed top down). The overlap can be, e.g., up to about 12 nm. In this way, the gate contact 162 can fully occupy available space between S/D regions 116 without shorting or substantially interfering with contacts 126. Gate contact 162 can connect with metal line 170 where the connection point can overlap the S/D region 116. The gate contact 162 is isolated from contact 126 by spacer 146.

The gate tie-down 160 can extend above the contact 128 on one side and can connect to contact 128 on the other side by sitting on top of contact 128 and gate metal 110. In this way, an electrical connection is made between one of the contacts 128 and the gate metal 110 by a lower portion of the gate tie-down 160. The other contact 128 that is isolated from the gate tie-down 160 by the spacer 146 has a height that is lower than a height of the gate tie-down 160.

In addition, fanout of the tapered profile of the gate tie-down 160 overlaps one contact 128 completely or almost completely and partially overlaps the other contact 128 (e.g., when viewed top down). Said differently, the gate tie-down 160 can include an asymmetric configuration that partially overlaps with the isolated contact 128 on one side and completely or partially overlaps the connected contact 128 on the other side. The overlap for the contact 128 isolated from the gate tie-down 160 can be, e.g., up to about 12 nm. The overlap for the contact 128 connected to the gate tie-down 160 can be, e.g., greater than about 5 nm. The gate tie-down 160 fully occupies the available space. The gate tie-down 160 and the gate contact 162 can be formed concurrently from a same material in a same process step. In addition, the other vias 164 can also be formed concurrently with the gate tie-down 160 and the gate contact 162. Gate tie-down 160 can connect with power rail 172 to tie down the gate metal 110.

Figure 9:
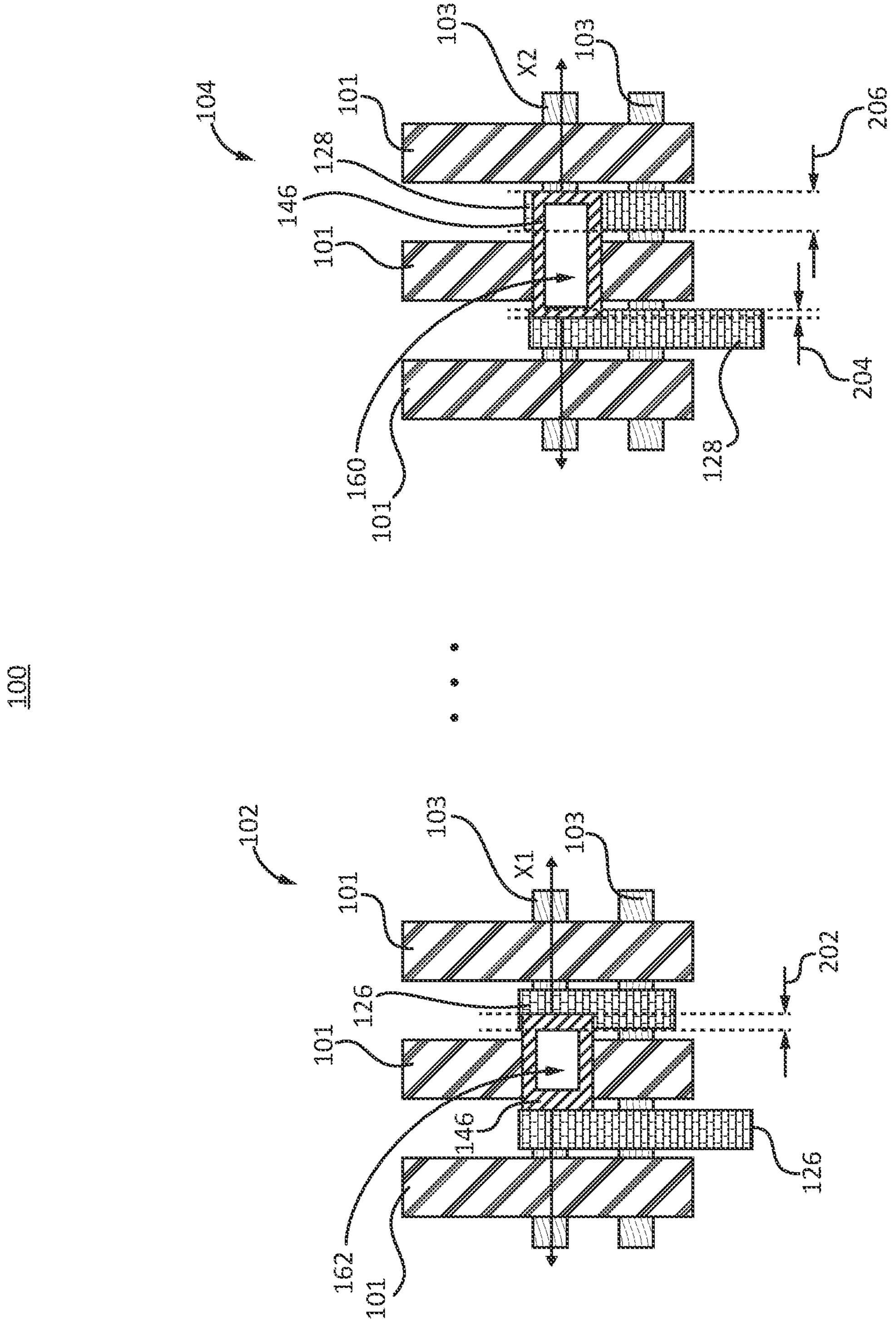
FIG. 9 shows magnified layout views of the semiconductor device showing overlap regions in greater detail, in accordance with an embodiment of the present invention.

Referring to FIG. 9, a magnified device layout view of semiconductor device 100 shows the gate contact 162 in inset 102 and the tie-down 160 in inset 104. The gate contact 162 extends above the contacts 126 over active regions 103 (for the S/D regions 116). An overlap 202 can be, e.g., up to about 12 nm. The gate tie-down 160 can extend above the contact 128 on one side and connect to contact 128 on the other side by sitting on top of contact 128 and gate metal 110. The gate tie-down 160 can include an asymmetric configuration that partially overlaps (overlap 204) with the isolated contact 128 on one side and completely or partially overlaps (overlap 206) the connected contact 128 on the other side. The overlap 204 for the contact 128 isolated from the gate tie-down 160 can be, e.g., up to about 12 nm. The overlap 206 for the contact 128 connected to the gate tie-down 160 can be, e.g., greater than about 5 nm. In some embodiments, the overlap 206 can be from 1 nm to 10 nm or more. The gate tie-down 160 fully occupies the available space. The gate tie-down 160 and the gate contact 162 can be formed concurrently from a same material in a same process step. In addition, the other vias 164 can also be formed concurrently with the gate tie-down 160 and the gate contact 162. Gate tie-down 160 can connect with power rail 172 to tie down the gate metal 110.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," "top," "bottom," "backside," "frontside" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS, For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:

a first gate structure having a gate metal;

a gate contact connected to the gate metal of the first gate structure, the gate contact being disposed between first source/drain contacts and having a height greater than the first source/drain contacts to overlap the first source/drain contacts;

a second gate structure having a gate metal; and a gate tie-down connected to the gate metal of the second gate structure and one of a pair of second source/drain contacts, the gate tie-down having a height greater than the pair of second source/drain contacts to overlap the other of the pair of second source/drain contacts.

2. The semiconductor device as recited in claim 1, wherein the gate tie-down is disposed asymmetrically between the pair of second source/drain contacts such that the gate tie-down is over the one of the pair of second source/drain contacts.

3. The semiconductor device as recited in claim 1, wherein the gate tie-down is electrically isolated from the other of the pair of second source/drain contacts.

4. The semiconductor device as recited in claim 1, further comprising a spacer disposed between the gate tie-down and the other of the pair of second source/drain contacts.

5. The semiconductor device as recited in claim 1, wherein the gate contact overlaps at least one of the first source/drain contacts such that the gate contact connects to a metal line over a source/drain region.

6. The semiconductor device as recited in claim 1, wherein the gate contact is electrically isolated from the first source/drain contacts by a spacer disposed between the gate contact and the first source/drain contacts.

7. The semiconductor device as recited in claim 1, wherein the gate contact and the gate tie-down include a same material.

8. The semiconductor device as recited in claim 1, wherein the gate tie-down connects to an M1 power rail.

9. A semiconductor device, comprising:

a first gate structure having a gate metal;

a gate contact connected to the gate metal of the first gate structure, the gate contact being disposed between first source/drain contacts and having a height greater than the first source/drain contacts to overlap the first source/drain contacts;

a first spacer disposed about a lateral portion of the gate contact to electrically isolate the gate contact from the first source/drain contacts;

a second gate structure having a gate metal;

a gate tie-down connected to the gate metal of the second gate structure and one of a pair of second source/drain contacts, the gate tie-down having a height greater than the pair of second source/drain contacts to overlap the other of the pair of second source/drain contacts; and a second spacer disposed about a lateral portion of the gate tie-down to electrically isolate the gate tie-down from the other of the pair of second source/drain contacts.

10. The semiconductor device as recited in claim 9, wherein the gate tie-down is disposed asymmetrically between the pair of second source/drain contacts such that the gate tie-down is over the one of the pair of second source/drain contacts.

11. The semiconductor device as recited in claim 9, wherein the gate contact overlaps at least one of the first source/drain contacts such that the gate contact connects to a metal line over a source/drain region.

12. The semiconductor device as recited in claim 9, wherein the gate contact and the gate tie-down include a same material.

13. The semiconductor device as recited in claim 9, wherein the first spacer and the second spacer include a same material.

14. The semiconductor device as recited in claim 9, wherein the gate tie-down connects to an M1 power rail.

15. A method for fabricating a semiconductor device, comprising:

forming dielectric caps over gate metal of gate structures;

depositing a first dielectric layer over the dielectric caps;

forming source/drain contacts between the gate structures;

depositing a second dielectric layer over the source/drain contacts;

exposing the gate metal and the source/drain contacts by forming openings in different regions through the second dielectric layer;

forming a dielectric spacer in the openings; and concurrently forming a gate contact and a gate tie-down in the openings where the gate contact electrically connects to the gate metal and the gate tie-down electrically connects to the gate metal and one of the source/drain contacts, wherein the source/drain contacts include first source/drain contacts between which the gate contact is formed, the gate contact having a height greater than a height of each of the first source/drain contacts to overlap the first source/drain contacts.

16. The method as recited in claim 15, wherein the gate tie-down is formed on top of the one of the source/drain contacts.

17. The method as recited in claim 15, wherein the dielectric spacer electrically isolates the gate contact from the first source/drain contacts.

18. The method as recited in claim 15, wherein the gate tie-down connects to an M1 power rail.

19. The method as recited in claim 15, wherein concurrently forming the gate contact and the gate tie-down includes concurrently forming the gate contact and the gate tie-down in the openings and vias in via openings.

20. The method as recited in claim 19, wherein the gate tie-down connects to an M1 power rail by one of the vias.

* * * * *